(12) United States Patent
Lee

(10) Patent No.: US 6,373,913 B1
(45) Date of Patent: Apr. 16, 2002

(54) INTERNAL CLOCK SIGNAL GENERATOR INCLUDING CIRCUIT FOR ACCURATELY SYNCHRONIZING INTERNAL CLOCK SIGNAL WITH EXTERNAL CLOCK SIGNAL

(75) Inventor: Jung-bae Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/168,535

(22) Filed: Oct. 8, 1998

(30) Foreign Application Priority Data

Dec. 2, 1997 (KR) .............................................. 97-65247

(51) Int. Cl.[7] .............................. H03D 3/24; H03L 7/06
(52) U.S. Cl. ...................................... 375/376; 327/147
(58) Field of Search .............................. 375/376, 373, 375/375, 354, 362, 393, 394, 327; 327/147–156, 158, 161, 149, 152, 153, 141; 365/233, 194

(56) References Cited

U.S. PATENT DOCUMENTS

| | | | |
|---|---|---|---|
| 4,755,704 A | | 7/1988 | Floira et al. .................. 307/269 |
| 4,868,514 A | | 9/1989 | Azevedo et al. ............. 328/155 |
| 4,975,605 A | * | 12/1990 | Bazes ........................... 327/161 |
| 5,049,766 A | | 9/1991 | van Driest et al. .......... 307/269 |
| 5,109,394 A | * | 4/1992 | Hjerpe et al. ................. 375/373 |
| 5,451,894 A | | 9/1995 | Guo ............................... 327/241 |
| 5,751,665 A | * | 5/1998 | Tanoi ............................ 368/120 |
| 5,901,190 A | | 5/1999 | Lee ............................... 375/373 |
| 5,969,551 A | * | 10/1999 | Fujioka ......................... 327/149 |
| 6,049,241 A | * | 4/2000 | Brown et al. ................. 327/295 |
| 6,128,248 A | * | 10/2000 | Idei et al. ..................... 365/233 |

FOREIGN PATENT DOCUMENTS

KR  10-1997-0063112  6/1999  ............. H03L/7/00

OTHER PUBLICATIONS

Notice to Submit Response, Korean Industrial Property Office, Korean Patent Application No. 10–1997–0065247 (Dec. 18, 1999).
English Translation, Notice to Submit Response, Korean Industrial Property Office, Korean Patent Application No. 10–1997–0065247 (Dec. 18, 1999).
Okajima et al., "Digital Delay Locked Loop ad Design Technique for High–Speed Synchronous Interface", IEEE Trands. Electron., vol. E79–Cc, No. 6, Jun. 1996, pp. 798–807.
Jung–bae Lee, U.S. Patenet Application, Serial No. 09/196994, filed Nov. 20, 1998.

* cited by examiner

Primary Examiner—Don N. Vo
Assistant Examiner—Khai Tran
(74) Attorney, Agent, or Firm—Myers Bigel Sibley & Sajovec

(57) ABSTRACT

An internal clock signal generator is provided which includes a synchronized delay circuit which receives an external clock signal and outputs a clock signal which is coarsely synchronized with the external clock signal. A delay locked loop (DLL) or phase locked loop (PLL) receives the coarsely synchronized clock signal and generates an internal clock signal which is more finely synchronized with the external clock signal.

16 Claims, 7 Drawing Sheets

INTERNAL CLOCK SIGNAL GENERATOR INCLUDING CIRCUIT FOR ACCURATELY SYNCHRONIZING INTERNAL CLOCK SIGNAL WITH EXTERNAL CLOCK SIGNAL

FIELD OF THE INVENTION

The present invention relates to clock signal generators suitable for use in an integrated circuit memory device. More particularly, the present invention relates to an internal clock signal generator for synchronizing an internal clock with an external clock signal.

BACKGROUND OF THE INVENTION

Integrated circuit devices such as an integrated circuit memory or central processing units, which operate in synchronization with an external clock signal, typically generate an internal clock signal using a clock buffer and a clock driver. As a result, the internal clock signal may be delayed compared to the external clock signal. Such a delay may cause deterioration in the performance of the device during high frequency operation. In particular, at high frequencies of operation, the access time $t_{ac}$ (i.e., the time required for outputting data after an external clock signal is input) may become longer than the time required for generating an internal clock signal from the received external clock signal. Deterioration of the performance of a semiconductor device at higher frequencies may be reduced by synchronizing the internal clock signal with the external clock signal. Conventionally, this synchronization may be accomplished with a delay locked loop (DLL) or a phase locked loop (PLL) which are used as the internal clock signal generator.

FIG. 1 is a schematic diagram of a conventional DLL. As seen in FIG. 1, the DLL includes a phase detector 1, a low pass filter (LFF) 2, and a voltage control delay line 3. The phase detector 1 compares the phases of an external clock signal Ext.CLK and an internal clock signal Int.CLK and detects the difference between the phases. The LPF 2 is connected to the output of the phase detector 1 and generates a control voltage $v_{cont}$ for controlling the delay time of the voltage control delay line 3. The voltage control delay line 3 typically includes a plurality of inverters which are serially connected and outputs the internal clock signal Int.CLK by delaying the external clock signal by a predetermined time specified by the voltage control input. Unfortunately, however, synchronizing the internal clock signal with the external clock signal may take hundreds of cycles of the external clock signal. Furthermore, the DLL circuit may require several tens of milliamps of current during operation. Therefore, it may be difficult to utilize the DLL in an integrated circuit device.

FIG. 2 is a schematic diagram of a conventional PLL. As seen in FIG. 2, the PLL includes a phase-frequency detector 11, a LPF 12, and a voltage control delay line 13. The phase-frequency detector 11 compares the phases and frequencies of the external clock signal Ext.CLK and the internal clock signal Int.CLK, and detects the differences in phases and frequencies. The LPF 12 is connected to the output of the phase detector 11 and generates a control voltage $v_{cont}$ for controlling the delay time of the voltage control delay line 13. The voltage control delay line 13 outputs the internal clock signal Int.CLK in response to the control voltage $v_{cont}$ and the internal clock signal Int.CLK which is fed back to the input of the voltage control delay line 13. Thus, the voltage control delay line 13 acts as a ring oscillator.

The PLL of FIG. 2, however, may have the same problems as the DLL of FIG. 1. Recently, the PLL and the DLL have been coupled together to utilize the quick locking time of the PLL and the wide locking range of the DLL. However, this combination may not solve all of the problems with the DLL and the PLL.

As a result of the shortcomings of the PLL and the DLL, a synchronized delay circuit has been suggested which uses simple delay means to match the phase of the internal clock signal with the phase of the external clock signal. This phase matching may be accomplished by making the delay time of the internal clock signal an integer multiple of the period of the external clock signal. In such a system, a synchronous delay line (SDL), a synchronous mirror delay (SMD), and a hierarchical phase lock delay (HPLD) may be utilized as the synchronized delay circuit.

FIG. 3 is a schematic diagram of a conventional synchronous delay circuit. As seen in FIG. 3, the synchronous delay line includes a clock buffer 21, a dummy clock delay 22, a first clock delay portion 23, a comparing portion 24, a second clock delay portion 25, and a clock driver 26. In the circuit of FIG. 3, the clock buffer 21 receives an external clock signal Ext.CLK and outputs a first clock signal CLK1 in which the external clock signal is delayed by a first delay time d1. As is further seen in FIG. 3, tCK represents the period of the external clock signal. The dummy clock delay 22 controls the phase difference between the external clock signal and internal clock signal Int.CLK such that the phase difference is an integer multiple of the period tCK. The dummy clock delay 22 delays the first clock signal CLK1 by the sum of the first delay time d1 and a second delay time d2 to provide a second clock signal CLK2.

The first clock delay portion 23 includes first unit delays 27 which are serially connected and which output a third clock signal CLK3. The output CLK3 is a delayed version of the second clock signal CLK2 and may be delayed by different times. The comparing portion 24 includes a plurality of comparators 28 which compare the first clock signal CLK1 with the third clock signal CLK3 delayed by the period tCK from the first clock signal CLK1. Thus, a fourth clock signal is delayed by the difference between the period tCK and the sum of the first and second delay times d1 and d2 compared with the second clock signal CLK2.

The second clock delay portion 25 includes second unit delays 29 which are connected in series and output a fifth clock signal CLK5 by delaying the first clock signal CLK1 by the difference between the period tCK and the sum of the first and second delay times d1 and d2. The clock driver 26 outputs the internal clock signal Int.CLK delayed by the second delay time d2 by receiving the fifth clock signal CLK5. FIG. 4 is a timing diagram illustrating the operational state of the synchronous delay line of FIG. 3. As seen in FIG. 4, the first clock signal CLK1 is delayed by a first time d1 when compared with the external clock signal Ext.CLK. The second clock signal CLK2 is delayed by the sum of the first delay time d1 and a second delay time d2 compared with the first clock signal CLK1. The third clock signal CLK3 is the second clock signal CLK2 delayed by an integer multiple of the delay time of the first unit delay 27. The fourth clock signal CLK4 is one of the third clock signal CLK3 which was delayed by an integer multiple of the period tCK of the external clock Ext.CLK. In the embodiment illustrated in FIG. 3, the fourth clock signal CLK4 corresponds to the clock signal CLK1 delayed by one period of the external clock signal.

The fifth clock signal CLK5 corresponds to the fourth clock signal CLK4 delayed by the difference tCK minus (d1+d2) between the period tCK of the external clock signal Ext.CLK and the sum of the first delay time d1 and the second delay time d2. The Internal clock signal Int.CLK then corresponds to the fifth clock signal CLK5 delayed by the second delay time d2. Thus, the internal clock signal Int.CLK is delayed from the external clock signal Ext.CLK by twice the period tCK of the external clock signal. Thus, the internal clock signal Int.CLK is synchronized with the external clock signal Ext.CLK.

The conventional SDL circuit described above is an open loop circuit unlike the PLL and DLL circuits which are closed loop circuits. Thus, the locking time of the SDL circuit is an integer multiple of the period tCK of the external clock signal. Accordingly, the locking time of the SDL circuit may be shorter than the locking time of the PLL and DLL circuits. However, the degree of locking accuracy of the SDL circuit may be lower than the PLL or DLL circuits because the SDL circuits may have a narrow margin of its locking range.

SUMMARY OF THE INVENTION

In view of the above discussion, it is an object of the present invention to provide for the synchronization of an internal clock to an external clock with less delay in locking to the external clock signal than may be experienced in using a phase locked loop or a delay locked loop.

Another object of the present invention is to provide an internal clock which can be more closely synchronized to an external clock than is provided in a synchronized delay circuit.

These and other objects of the present invention are provided by an internal clock signal generator which utilizes a synchronized delay circuit to provide a coarsely synchronized clock signal which is then more finely synchronized to the external clock by either a delay locked loop or a phase locked loop. By first synchronizing the signal to the external clock with a synchronized delay circuit the coarse clock signal may be rapidly generated. By utilizing the coarse clock signal with either the delay locked loop or the phase locked loop, these loops may more quickly lock on the external clock signal to provide the finely synchronized signal. Thus, the advantages of both the synchronized delay line and the delay or phase locked loops may be obtained through use of the present invention.

In a particular embodiment of the present invention, an internal clock signal generator is provided which includes a synchronized delay circuit which receives an external clock signal and outputs a clock signal which is coarsely synchronized with the external clock signal. A delay locked loop (DLL) receives the coarsely synchronized clock signal and generates an internal clock signal which is more finely synchronized with the external clock signal.

In an alternative embodiment, a phase locked loop (DLL) receives a coarsely synchronized clock signal and generates an internal clock signal which is more finely synchronized with the external clock signal.

In particular embodiments of the present invention, the synchronized delay circuit is one of synchronous a delay line (SDL), a synchronous mirror delay (SMD) and a hierarchical phase locking delay (HPLD). Accordingly, the synchronized delay circuit may include a plurality of serially connected unit delays which provide a corresponding plurality of delayed clock signals. A controller selects one of the plurality of clock signals which is coarsely synchronized with the external clock signal and generates a flag signal for enabling the DLL or the PLL. The DLL or PLL is enabled by the flag signal and generates the internal clock signal which corresponds to the external clock signal delayed by an integer multiple of the period of the external clock signal.

The synchronized delay circuit may also include a clock buffer which receives the external clock signal and outputs a delayed first clock signal corresponding to the external clock signal delayed by a first delay time. A first dummy clock delay receives the delayed first clock signal and outputs a second delayed clock signal corresponding to the first delayed clock signal delayed by a second delay time. A first variable clock delay circuit receives the second delayed clock and outputs a plurality of third delayed clock signals corresponding to the second delayed clock delayed by integer multiples of a unit delay time. A plurality of comparators receive the third delayed clock signals and the first delayed clock signal and compare the phases of each third clock signal and the first clock signal to generate first control signals and the flag signal.

In a particular embodiment, the DLL includes a second variable clock delay circuit which receives the first delayed clock and which generates a plurality of fourth delayed clock signals corresponding to the first delayed clock delayed by integer multiples of a second unit delay time. The second variable clock delay further includes switching means responsive to the first control signals for selectively outputting one of the plurality of fourth delayed clock signals where the duration of the second unit delay time is controlled by a second control signal. A clock driver receives the selected fourth clock signals and outputs the fourth clock signal delayed by a predetermined time so as to provide an internal clock signal. A second dummy clock delay receives the internal clock signal and outputs the fourth clock signal delayed by a fourth delay time so as to provide a fifth delayed clock signal. A phase detector receives the fifth delayed clock signal and the first delayed clock signal and detects the phase difference therebetween. A low pass filter (LPF) connected to the output of the phase detector outputs the second control voltage so as to control the second unit delay time.

In further embodiments of the present invention, the second delay time is the sum of the delay time of the clock buffer and the delay time of the clock driver. The second unit delay time may also vary between the unit delay time and twice the unit delay time based on the second control voltage. The fourth delay time may also be equal to the delay time of the clock buffer. The second variable clock delay circuit may also be a voltage-controlled delay line in which the second unit delays are controlled by the second control voltage and the flag signal. The second variable clock delay circuit may also output one of the plurality of third clock signals whose phase coincides with that of the first clock signal.

In yet another embodiment of the present invention, each comparator includes a first latch which latches one of the plurality of third clock signals when the first clock signal is in a one logic state. A second latch latches the output of the first latch when the first clock signal transitions to a zero logic state. The output of the second latch then generates a first control signal which controls the switching means corresponding to the comparator. The flag signal may also be generated by a combination of first control signals generated by the comparators. A plurality of comparators receive the third delayed clock signals and the first delayed clock signal and compare the phases of each third clock signal and the first clock signal to generate first control signals and the flag signal.

In a particular embodiment of the present invention, the PLL includes a second variable clock delay circuit which receives the first delayed clock and which generates a plurality of fourth delayed clock signals corresponding to the first delayed clock delayed by integer multiples of a second unit delay time. The second variable clock delay further includes switching means responsive to the first control signals for selectively outputting one of the plurality of fourth delayed clock signals and wherein the duration of the second unit delay time is controlled by a second control signal. A clock driver receives the selected fourth clock signals and outputs the fourth clock signal delayed by a predetermined time so as to provide an internal clock signal. A second dummy clock delay receives the internal clock signal and outputs the fourth clock signal delayed by a fourth delay time so as to provide a fifth delayed clock signal. An inverter for inverting the fifth delayed clock signal output from the second dummy clock delay provides an inverted fifth delayed clock signal. A phase detector receives the inverted fifth delayed clock signal and the first delayed clock signal and detects the phase difference therebetween. A low pass filter (LPF) connected to the output of the phase detector outputs the second control voltage so as to control the second unit delay time.

In another embodiment, the second variable clock delay circuit is controlled by the second control voltage and forms an oscillator together with the clock buffer, the second dummy clock delay and the inverter.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
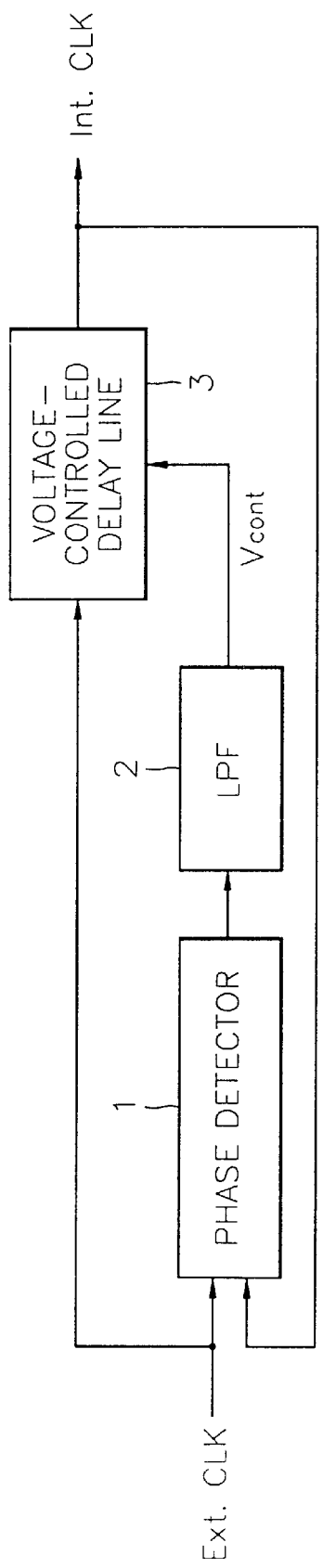
FIG. 1 is a schematic diagram of a conventional delay locked loop (DLL)
Figure 2:
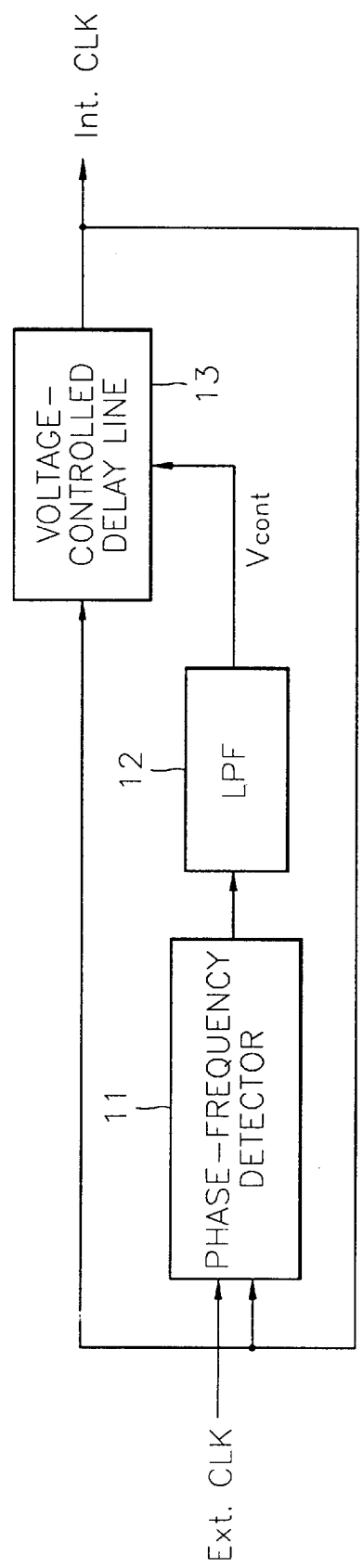
FIG. 2 is a schematic diagram of a conventional phase locked loop (PLL)
Figure 3:
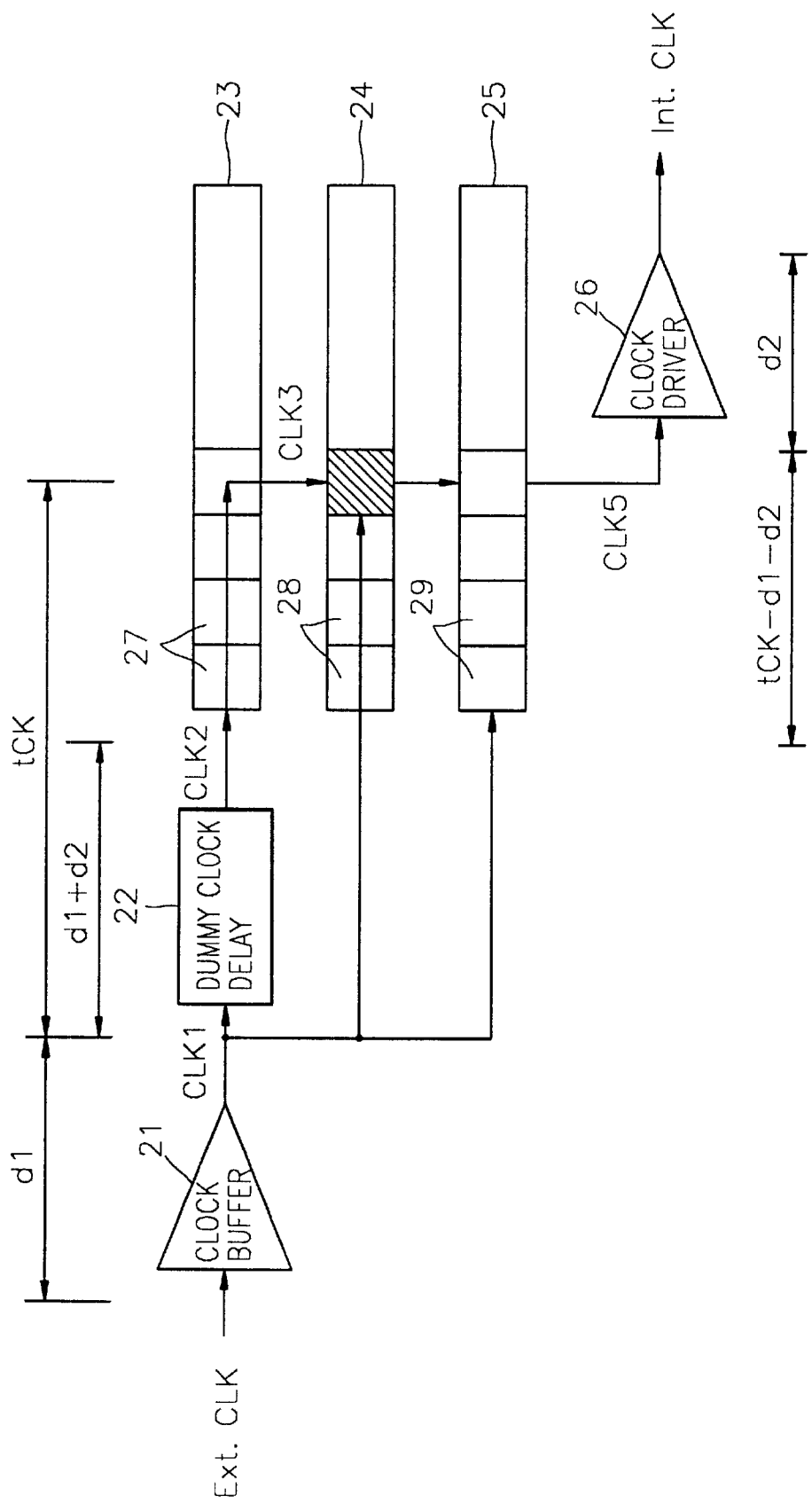
FIG. 3 is a schematic diagram of a conventional synchronous delay line (SDL)
Figure 4:
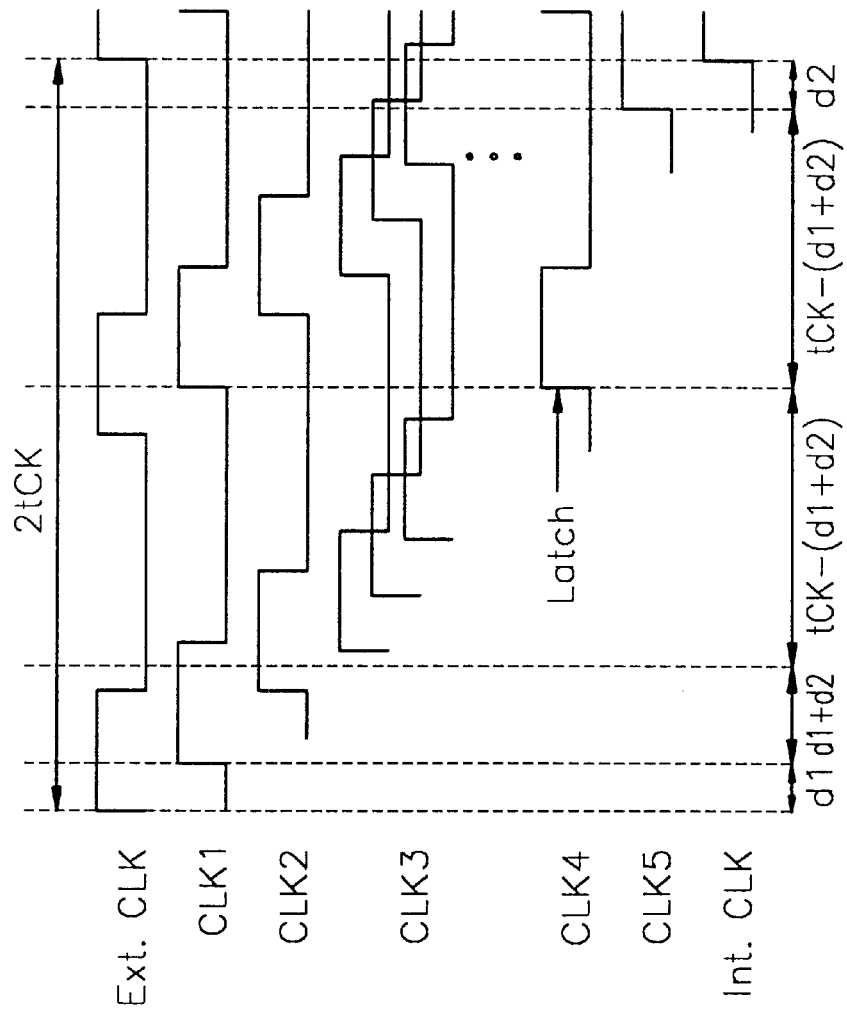
FIG. 4 is a timing diagram illustrating the operational state of the synchronous delay line (SDL) of FIG. 3.
Figure 5:
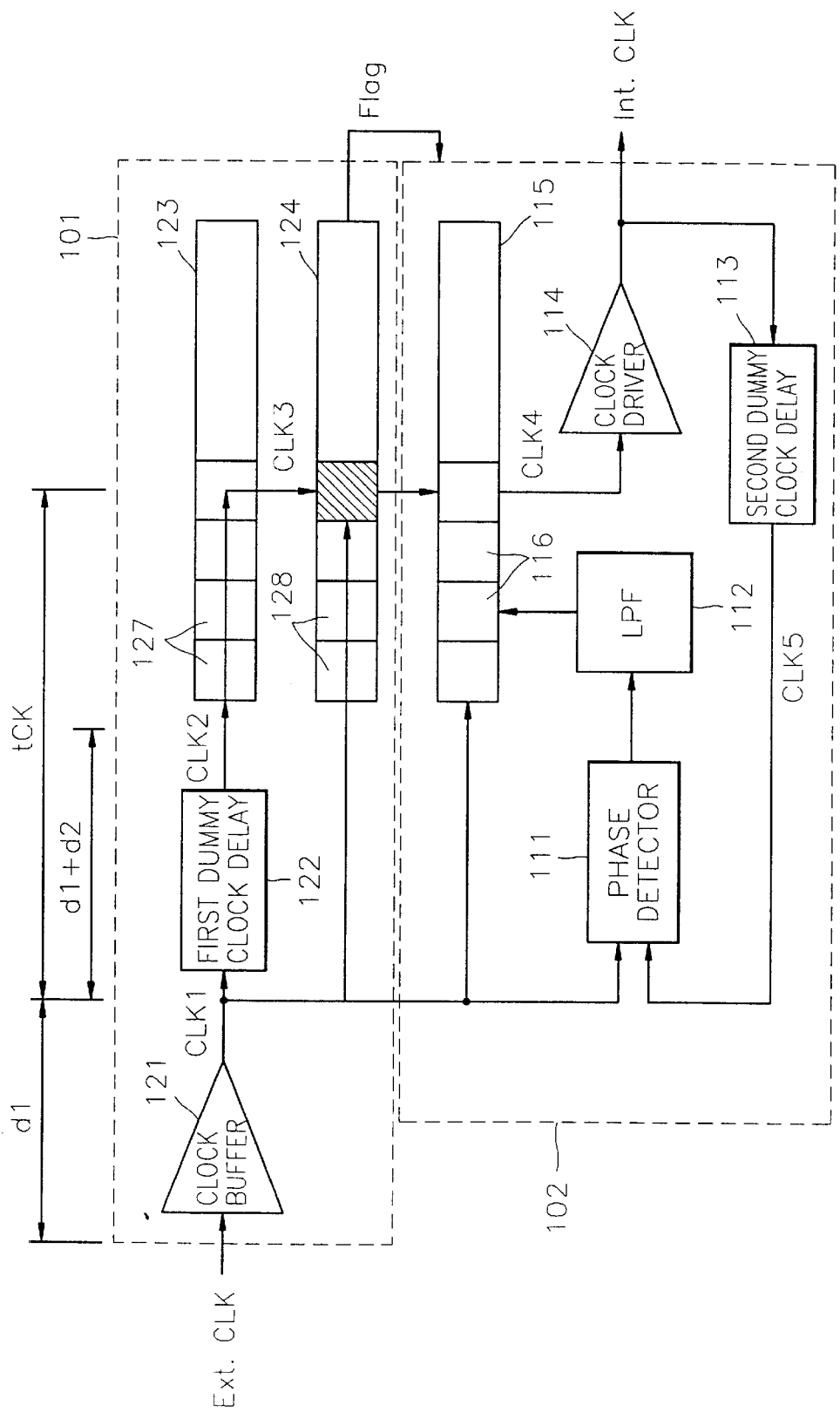
FIG. 5 is a schematic diagram of an internal clock signal generator according to a first embodiment of the present invention.

Referring to FIG. 5, a delay locked loop (DLL) 102 is connected to a synchronized delay circuit 101. The synchronized delay circuit 101 generates a coarse phase locking clock signal which is delayed by an integer multiple of the period of the external clock signal Ext.CLK, e.g., twice the period. The DLL 102 generates a fine phase locking internal clock signal Int.CLK, whose phase is further finely locked with the external clock signal Ext.CLK by receiving clock signals output from the synchronized delay circuit 101.

The synchronized delay circuit 101, illustrated in FIG. 5 as a synchronous delay line (SDL), includes a clock buffer 121, a first dummy clock delay 122, a first variable clock delay circuit 123 and a comparator circuit 124. The DLL 102 includes a phase detector 111, a low pass filter (LPF) 112, a second dummy clock delay 113, a clock driver 114 and a second variable clock delay circuit 115. As illustrated in FIG. 5, tCK represents the period of the external clock signal Ext.CLK.

The clock buffer 121 receives the external clock signal Ext.CLK, buffers the signal and outputs a first clock signal CLK1 in which the external clock signal Ext.CLK is delayed by a first delay time d1. The clock buffer 121 may include a differential amplifier and a plurality of serially connected inverters (not shown).

The first dummy clock delay 122 controls the phase difference between the external clock signal Ext.CLK and the internal clock signal Int.CLK to be an integer multiple of the period tCK. The first dummy clock delay 122 delays the first clock signal CLK1 by the sum of a second delay time d2 and the first delay time d1.

The first variable clock delay circuit 123 includes a plurality of first unit delays 127 which are connected in series. The first variable clock delay circuit 123 generates a plurality of third clock signals CLK3. These third clock signals CLK3 result from the first unit delays 127 each delaying the clock signal such that the plurality of third clock signals are each delayed by an integer multiple of the delay time of the first unit delays 127.

The comparator circuit 124 includes a plurality of comparators 128 for comparing the first clock signal CLK1 output by the clock buffer 121 with the third clock signals CLK3. The comparators 128 compare the phases of each third clock signal CLK3 and the first clock CLK1, to output a flag signal which enables the DLL 102.

As will be appreciated by those of skill in the art, a synchronous mirror delay (SMD) or a hierarchical phase locking delay (HPLD), instead of the SDL, can be used as the synchronized delay circuit 101 while still benefiting from the teachings of the present invention.

The second variable clock delay circuit 115 includes a plurality of second unit delays 116 which generate a plurality of fourth clock signals CLK4 one of which corresponds to the first clock signal CLK1 delayed by the difference between the period tCK and the sum of the first and second delay times d1 and d2.

The clock driver 114 receives the fourth clock signal CLK4 corresponding to the first clock signal delayed by the difference between the period tCK and the sum of the first and second delay times d1 and d2 and outputs an internal clock signal Int.CLK corresponding to the selected fourth clock signal delayed by the second delay time d2. This internal clock signal Int.CLK may be used for driving the internal circuits of a semiconductor memory device.

The second dummy clock delay 113 receives the internal clock signal Int.CLK and delays the internal clock signal Int.CLK by an integer multiple of the period of the external clock signal Ext.CLK, e.g., twice the period. The second dummy clock delay 113 outputs a fifth clock signal CLK5 which is delayed from the internal clock signal Int.CLK by the first delay time d1. Delaying the internal clock signal Int.CLK by the first delay time d1 in the second dummy clock delay 113 compensates the Int.CLK to correspond to the first clock signal CLK1.

The first clock signal CLK1 and the fifth clock signal CLK5 are input to the phase detector 111. The phase detector 111 compares the phase of the first clock signal CLK1 and that of the fifth clock signal CLK5 and outputs the results of this comparison to the LPF 112. The LPF 112 generates a control voltage $V_{cont}$ which controls the delay time of the second variable clock delay circuit 115.

Thus, in the above-described internal clock signal generator according to the present invention, after generating a coarse locking clock signal with respect to an external clock signal in the synchronized delay circuit 101, the DLL 102 generates an internal clock signal whose phase is more finely locked to the external clock signal. Thus, the present invention may shorten the locking time of the DLL 102 through the provision of the coarsely locked clock signal.

Figure 6:
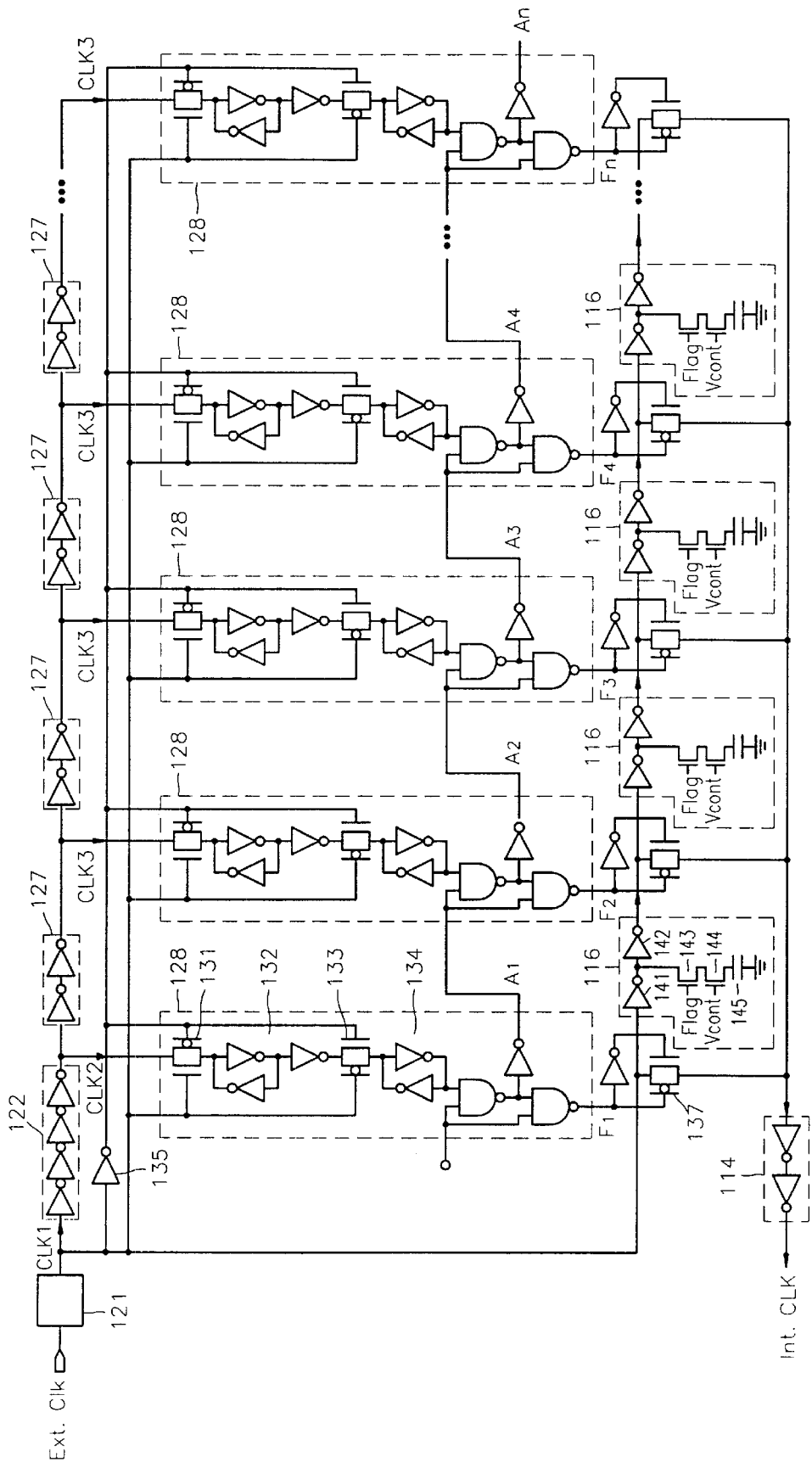
FIG. 6 is a circuit diagram of the synchronized delay circuit, a second clock delay portion and a clock driver shown in FIG. 5.

FIG. 6 is a circuit diagram of the synchronized delay circuit 101, the second variable clock delay circuit 115 and the clock driver 114 shown in FIG. 5. As seen in FIG. 6, the synchronized delay circuit 101 includes the clock buffer 121 which receives the external clock Ext.CLK and outputs the first clock signal CLK1 delayed by the first delay time, the first dummy clock delay 122 including a plurality of inverters, and the variable clock delay circuit 123 in which a plurality of first unit delays 127 each including two inverters connected in series. The first dummy clock delay 122 outputs the second clock signal CLK2 which is delayed from the first clock signal CLK1 by the sum of the second delay time d2 and the first delay time d1. The plurality of first unit delays 127 of the clock delay portion 123 output the third clock signals CLK3 which are differently delayed by an integer multiple of the delay time of each the first unit delays 127.

As is further seen in FIG. 6, comparators 128 are connected to the outputs of the first dummy clock delay 122 and the first unit delays 127. Each comparator 128 includes first and second transmission gates 131 and 133 which respond to logic low and logic high signals of the first clock signal CLK1, respectively. The comparators 128 also include first and second latches 132 and 134.

When the first transmission gate 131 is switched on by CLK1 going low, the first latches 132 latch the second clock signal CLK2 output from the first dummy clock delay 122 or one of the third clock signals CLK3 output from the first unit delays 127. When the second transmission gate 133 is activated by CLK1 going high, the second latches 134 latch the output of the first latches 132 and latch clock signal latched by the first latches 132. The second latches 134 outputs are used generate one of first control signals $F_1$–$F_n$ which activate one of the third transmission gates 137 connected to the outputs of second unit delays 116. The output of the second latches 134 is also used to generate second control signals $A_1$–$A_n$ which switch off the remainder of the third transmission gates 137 except for the transmission gate 137 which was activated by the first control signal. The first control signals $F_1$–$F_n$ activate a transmission gate 137 only when the rising and falling edges of the third clock signals CLK3 are the same as those of the first clock signal CLK1.

The comparator of the plurality of comparators 128, which is first to output the first control signal F to activate a transmission gate 137, also outputs a second control signal A which prevents subsequent transmission gates from being activated. Accordingly, in the circuit illustrated in FIG. 6, the other comparators 128 following the first comparator to output a logic low value output a logic high value for the first control signal F and a logic low second control signal A to deactivate their corresponding transmission gates and to propagate the blocking control signal A to subsequent comparators.

The second variable clock delay circuit 115 (see FIG. 5) includes second unit delays 116 and switches 137 each comprised of a transmission gate and an inverter. Each second unit delay 116 includes first and second inverters 141 and 142 which are connected in series, and first and second NMOS transistors 143 and 144 and capacitor 145 which are connected in sequence between the output of the first inverter 141 and a ground voltage VSS.

In detail, the first NMOS transistor 143 has a gate which receives a flag signal Flag and a drain connected to the output of the first inverter 141. The second NMOS transistor 144 has a gate which receives a control voltage $V_{cont}$ and a drain connected to the source of the first NMOS transistor 143. The capacitor 145 is connected between the source of the second NMOS transistor 144 and the ground voltage VSS.

While the flag signal Flag is logic high, the second NMOS transistor 144 is turned off. When the control voltage $V_{cont}$ becomes logic low the delay time of the second unit delay 116 becomes the same as that of the first unit delay 127. When the control voltage $V_{cont}$ becomes logic high, the second NMOS transistor 144 is turned on and the delay time of the second unit delay 116 becomes twice that of the first unit delay 127.

Thus, the delay time of each of the second unit delays 116 can be controlled linearly according to the control voltage $V_{cont}$. Also, the delay time of the second unit delay 116 may be equal to or less than twice that of the first unit delay 127, thereby further shortening the locking time compared to the conventional case.

Figure 7:
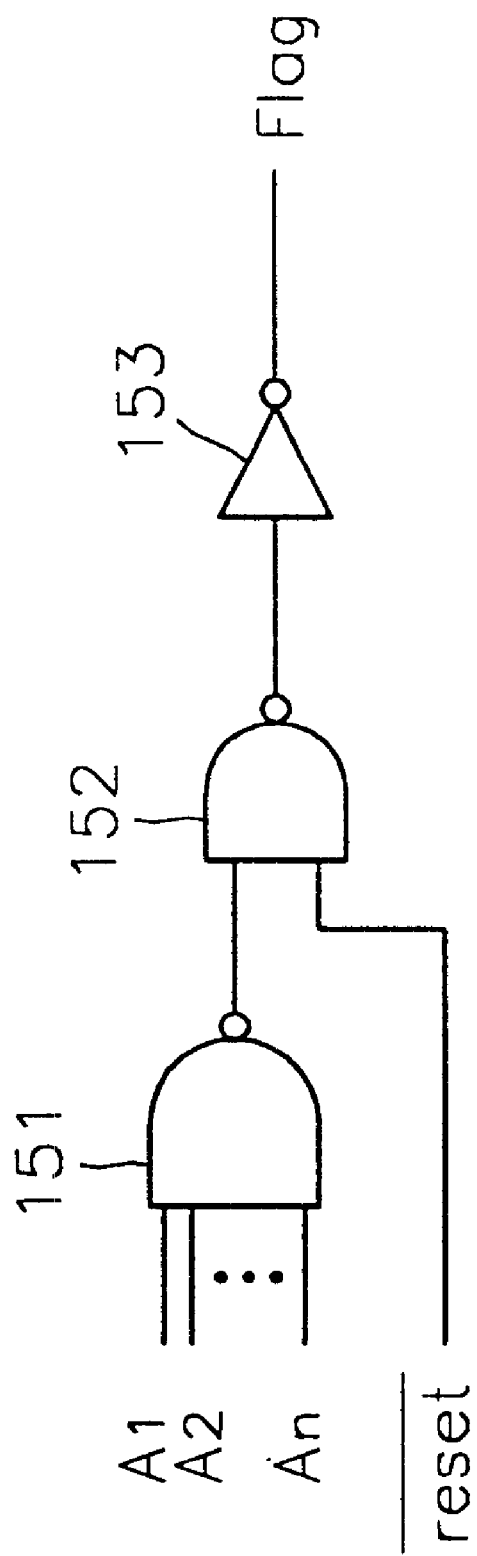
FIG. 7 is a circuit diagram of a flag signal generator for generating a flag signal shown in FIG. 5.

FIG. 7 is a circuit diagram of a flag signal generator for generating the flag signal Flag shown in FIG. 5. Referring to FIG. 7, the flag signal generator includes a first NAND gate 151 which receives the second control signals $A_1$–$A_n$ from the comparators 128 (see FIG. 6). A second NAND gate 152 receives the signal output from the first NAND gate 151 and a reset signal $\overline{reset}$. An inverter 153 for inverts the signal output from the second NAND gate 152 to provide the Flag signal. The reset signal $\overline{reset}$ disables the DLL 102 (see FIG. 5) and allows the DLL 102 to be disabled through an external input to the semiconductor memory device. As will be appreciated by those of skill in the art, various other combinatorial logic configurations may be utilized to result in the generation of the Flag signal when one of the A signals indicates that a comparator has found a matching CLK3 signal. For example, the inverter 153 may be eliminated if the NAND gate 152 is an AND gate. Thus, any number of circuits may be utilized such that when one of the second control signals $A_1$–$A_n$ is logic low and the reset signal $\overline{reset}$ is logic high, the flag signal Flag becomes logic high, so that the DLL 102 (see FIG. 5) is enabled.

Figure 8:
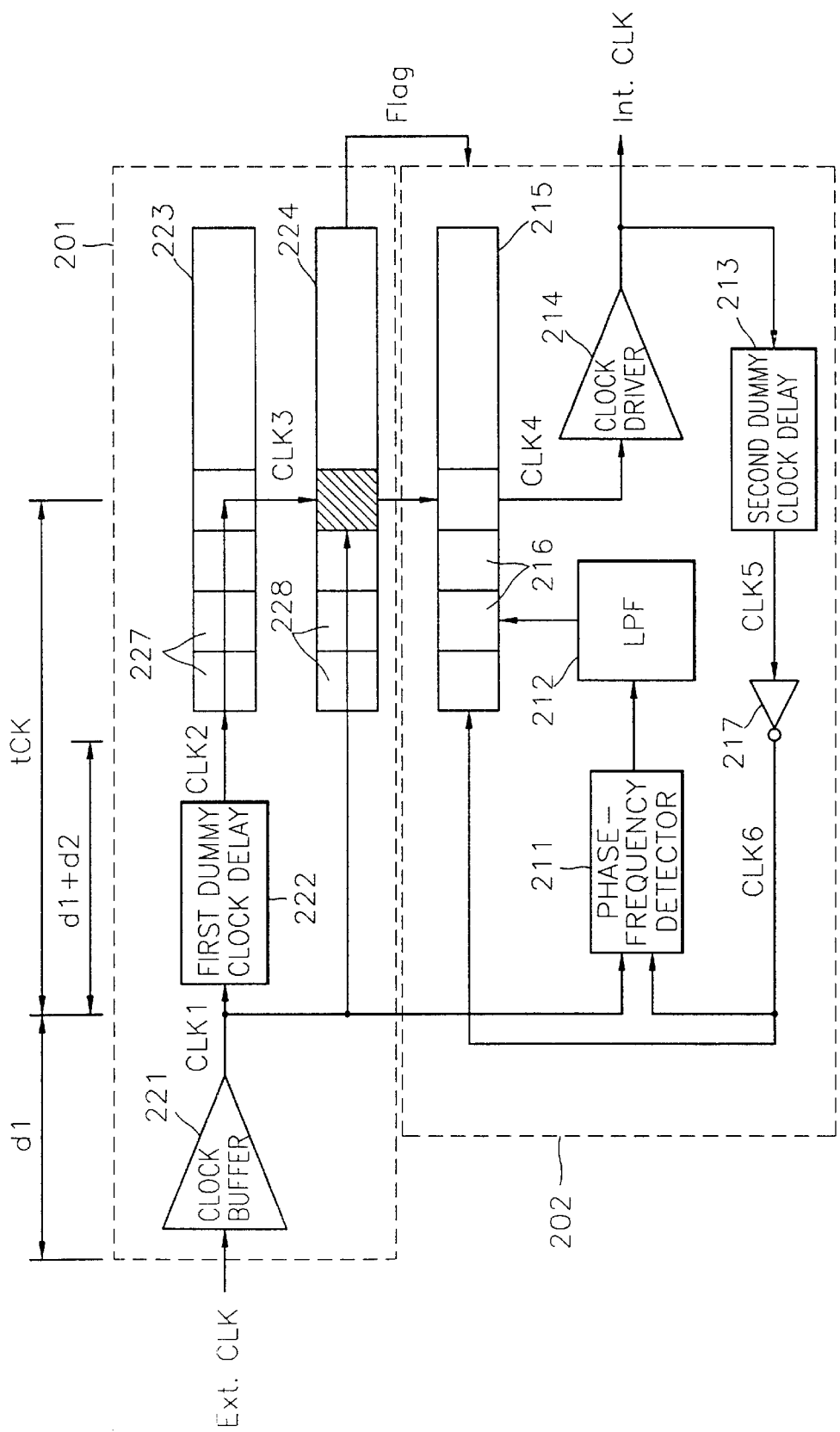
FIG. 8 is a schematic diagram of an internal clock signal generator according to a second embodiment of the present invention.

FIG. 8 is a schematic diagram of an internal clock signal generator according to a second embodiment of the present invention. Referring to FIG. 8, the PLL 202 is connected to a synchronized delay circuit 201. The synchronized delay circuit 201 includes a clock buffer 221, a first dummy clock delay 222, a first variable clock delay circuit 223 and comparator circuitry 224. The operation of the synchronized delay circuit 201 is the same as that of FIG. 5, except that the delay time of the first dummy clock delay 222 is twice the sum of the delay time d1 of the clock buffer 221 and the delay time d2 of the clock driver 214. Furthermore, while in FIG. 8 an SDL is illustrated as the synchronized delay circuit 201, an SMD or an HPLD may alternatively be used.

The PLL 202 includes a phase-frequency detector (PFD) 211, a LPF 212, a second dummy clock delay 213, a clock driver 214, a second variable clock delay circuit 215 and an inverter 217. The second variable clock delay circuit 215 includes a plurality of second unit delays 216 which are connected in series and output a fourth clock signal CLK4. The clock driver 214 outputs an internal clock signal Int.CLK delayed by the second delay time d2 by receiving the fourth clock signal CLK4.

The second dummy clock delay 213 outputs a fifth clock signal CLK5, delayed from the internal clock signal Int.CLK by the first delay time d1 to compensate for the first delay time d1 with respect to the external clock signal Ext.CLK in the clock buffer 221. The inverter 217 outputs a sixth clock signal CLK6 by inverting the fifth clock signal CLK5.

As is seen in FIG. 8, The second variable clock delay circuit 215, the clock driver 214, the second dummy clock delay 213 and the inverter 217 form a ring oscillator. Thus, the delay time of each of the second unit delays 216 becomes half of that of the first unit delays 227.

The PFD 211 receives the first clock signal CLK1 and the sixth clock signal CLK6 and detects the difference in phase. The LPF 212 is connected to the output of the PFD 211 and generates a control voltage $V_{cont}$ for controlling the delay time of each of the second unit delays 216.

In the circuit of FIG. 8, the delay time by the first dummy clock delay 222, which is required to synchronize the internal clock signal Int.CLK with the external clock signal Ext.CLK, is as follows.

First, assuming that the delay time of the second clock delay portion 215 is "x", the delay time by the ring oscillator is given by the following equation (1).

$$x + d2 + d1 = \frac{tCK}{2} \quad (1)$$

Thus, the delay time x is expressed by the following equation (2).

$$x = \frac{tCK}{2} \cdot (d1 + d2) \quad (2)$$

Since the delay time of the first clock delay portion 223 is equal to 2x, the delay time y of the first dummy clock delay 222 may be expressed by the following equation (3).

$$y = tCK \cdot 2t \quad (3)$$

Substituting equation (2) for equation (3), the following equation (4) is obtained.

$$y = 2(d1 + d2) \quad (4)$$

Accordingly, the first dummy clock delay 222 delays the first clock signal CLK1 by twice the sum of the first delay time d1 of the clock buffer 221 and the second delay time d2 of the clock driver 214.

Thus, in the above-described internal clock signal generator according to the present invention, after the synchronized delay circuit generates a clock signal whose phase is coarsely locked with respect to the external clock signal, the PLL having the structure of a ring oscillator generates an internal clock signal whose phase is finely locked with respect to the external clock signal.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An internal clock signal generator comprising:
   a synchronized delay circuit which receives an external clock signal and outputs a clock signal which is coarsely synchronized with the external clock signal; and
   a delay locked loop (DLL) which receives the coarsely synchronized clock signal and generates an internal clock signal which is more finely synchronized with the external clock signal;
   wherein the synchronized delay circuit comprises:
      a plurality of serially connected unit delays which provide a corresponding plurality of delayed clock signals; and
      a controller which selects one of the plurality of clock signals which is coarsely synchronized with the external clock signal and which generates a flag signal for enabling the DLL;
   wherein the DLL is enabled by the flag signal and generates the internal clock signal which corresponds to the external clock signal delayed by an integer multiple of the period of the external clock signal.

2. An internal clock signal generator comprising:
   a synchronized delay circuit which receives an external clock signal and outputs a clock signal which is coarsely synchronized with the external clock signal; and
   a delay locked loop (DLL) which receives the coarsely synchronized clock signal and generates an internal clock signal which is more finely synchronized with the external clock signal;
   wherein the synchronized delay circuit comprises:
      a clock buffer which receives the external clock signal and outputs a first delayed clock signal corresponding to the external clock signal delayed by a first delay time;
      a first dummy clock delay which receives the first delayed clock signal and outputs a second delayed clock signal corresponding to the first delayed clock signal delayed by a second delay time;
      a first variable clock delay circuit which receives the second delayed clock and which outputs a plurality of third delayed clock signals corresponding to the second delayed clock delayed by integer multiples of a unit delay time; and
      a plurality of comparators which receive the third delayed clock signals and the first delayed clock signal and compare the phases of each third delayed clock signal and the first clock signal to generate first control signals and the flag signal; and
   wherein the DLL comprises:
      a second variable clock delay circuit which receives the first delayed clock and which generates a plurality of fourth delayed clock signals corresponding to the first delayed clock delayed by integer multiples of a second unit delay time, wherein the second variable clock delay further comprises switching means responsive to the first control signals for selectively outputting one of the plurality of fourth delayed clock signals and wherein the duration of the second unit delay time is controlled by a second control signal;

a clock driver which receives the selected fourth delayed clock signals and which outputs the fourth clock signal delayed by a predetermined time so as to provide the internal clock signal;

a second dummy clock delay which receives the internal clock signal and outputs the fourth clock signal delayed by a fourth delay time so as to provide a fifth delayed clock signal;

a phase detector which receives the fifth delayed clock signal and the first delayed clock signal and detects the phase difference therebetween; and a low pass filter (LPF) connected to the output of the phase detector which outputs the second control voltage so as to control the second unit delay time.

3. The internal clock signal generator of claim 2, wherein the second delay time is the sum of the delay time of the clock buffer and the delay time of the clock driver.

4. The internal clock signal generator of claim 2, wherein the fourth delay time is equal to the delay time of the clock buffer.

5. The internal clock signal generator of claim 2, wherein the second variable clock delay circuit is a voltage-controlled delay line in which the second unit delays are controlled by the second control voltage and the flag signal.

6. The internal clock signal generator of claim 2, wherein the second variable clock delay circuit outputs one of the plurality of third clock signals whose phase coincides with that of the first clock signal.

7. The internal clock signal generator of claim 2, wherein each comparator comprises:
   a first latch which latches one of the plurality of third clock signals when the first clock signal is in a one logic state; and
   a second latch which latches the output of the first latch when the first clock signal transitions to a zero logic state wherein the output of the second latch generates a first control signal which controls the switching means corresponding to the comparator; and
   wherein the flag signal is generated by a combination of first control signals generated by the comparators.

8. The internal clock signal generator of claim 2, wherein the second unit delay time varies between the unit delay time and twice the unit delay time based on the second control voltage.

9. An internal clock signal generator comprising:
   a synchronized delay circuit which receives an external clock signal and outputs a clock signal which is coarsely synchronized with the external clock signal; and
   a phase locked loop (PLL) which receives the coarsely synchronized clock signal and generates an internal clock signal which is more finely synchronized with the external clock signal;
   wherein the synchronized delay circuit comprises:
      a plurality of serially connected unit delays which provide a corresponding plurality of delayed clock signals; and
      a controller which selects one of the plurality of clock signals which is coarsely synchronized with the external clock signal and which generates a flag signal for enabling the PLL,
   wherein the PLL is enabled by the flag signal and generates the internal clock signal which corresponds to the external clock signal delayed by an integer multiple of the period of the external clock signal.

10. An internal clock signal generator comprising:
   a synchronized delay circuit which receives an external clock signal and outputs a clock signal which is coarsely synchronized with the external clock signal; and
   a phase locked loop (PLL) which receives the coarsely synchronized clock signal and generates an internal clock signal which is more finely synchronized with the external clock signal;
   wherein the synchronized delay circuit comprises:
      a clock buffer which receives the external clock signal and outputs a first delayed clock signal corresponding to the external clock signal delayed by a first delay time;
      a first dummy clock delay which receives the first delayed clock signal and outputs a second delayed clock signal corresponding to the first delayed clock signal delayed by a second delay time;
      a first variable clock delay circuit which receives the second delayed clock and which outputs a plurality of third delayed clock signals corresponding to the second delayed clock delayed by integer multiples of a unit delay time; and
      a plurality of comparators which receive the third delayed clock signals and the first delayed clock signal and compare the phases of each third delayed clock signal and the first clock signal to generate first control signals and the flag signal; and
   and the PLL comprises:
      a second variable clock delay circuit which receives the first delayed clock and which generates a plurality of fourth delayed clock signals corresponding to the first delayed clock delayed by integer multiples of a second unit delay time, wherein the second variable clock delay further comprises switching means responsive to the first control signals for selectively outputting one of the plurality of fourth delayed clock signals and wherein the duration of the second unit delay time is controlled by a second control signal;
      a clock driver which receives the selected fourth delayed clock signals and which outputs the fourth clock signal delayed by a predetermined time so as to provide the internal clock signal;
      a second dummy clock delay which receives the internal clock signal and outputs the fourth clock signal delayed by a fourth delay time so as to provide a fifth delayed clock signal;
      an inverter for inverting the fifth delayed clock signal output from the second dummy clock delay so as to provide an inverted fifth delayed clock signal;
      a phase detector which receives the inverted fifth delayed clock signal and the first delayed clock signal and detects the phase difference therebetween; and
      a low pass filter (LPF) connected to the output of the phase detector which outputs the second control voltage so as to control the second unit delay time.

11. The internal clock signal generator of claim 10, wherein the second delay time is two times of the sum of the delay time of the clock buffer and the delay time of the clock driver.

12. The internal clock signal generator of claim 10, wherein the fourth delay time is equal to the delay time of the clock buffer.

13. The internal clock signal generator of claim 10, wherein the second variable clock delay circuit is controlled by the second control voltage and forms an oscillator together with the clock buffer, the second dummy clock delay and the inverter.

14. The internal clock signal generator of claim 10, wherein the third delay time is equal to half the second delay time.

15. The internal clock signal generator of claim 10, wherein each comparator comprises:

a first latch which latches one of the plurality of third clock signals when the first clock signal is in a one logic state; and a second latch which latches the output of the first latch when the first clock signal transitions to a zero logic state wherein the output of the second latch generates a first control signal which controls the switching means corresponding to the comparator; and wherein the flag signal is generated by a combination of first control signals generated by the comparators.

16. The internal clock signal generator of claim 10, wherein the second unit delay time varies between the unit delay time and twice the unit delay time based on the second control voltage.

* * * * *